(12) United States Patent
Hwang

(10) Patent No.: US 7,834,675 B2
(45) Date of Patent: Nov. 16, 2010

(54) CLOCK CONTROL CIRCUIT AND SEMICONDUCTOR MEMORY DEVICE USING THE SAME

(75) Inventor: Mi Hyun Hwang, Anyang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/229,361

(22) Filed: Aug. 22, 2008

(65) Prior Publication Data

US 2009/0267674 A1    Oct. 29, 2009

(30) Foreign Application Priority Data

Apr. 28, 2008    (KR) ...................... 10-2008-0039587

(51) Int. Cl.
*G06F 1/04* (2006.01)

(52) U.S. Cl. ....................................... 327/295; 327/299

(58) Field of Classification Search ........................ None
See application file for complete search history.

(56) References Cited

U.S. PATENT DOCUMENTS

| 7,024,598 B2 * | 4/2006 | Jeong et al. ................. 714/704 |
| 7,042,798 B2 * | 5/2006 | Kato et al. ............. 365/189.14 |
| 2006/0150135 A1 * | 7/2006 | Hamada et al. ................ 716/12 |
| 2006/0187718 A1 * | 8/2006 | Katayama .................... 365/188 |
| 2007/0210850 A1 | 9/2007 | Lee |
| 2008/0080268 A1 * | 4/2008 | Ha et al. ...................... 365/191 |
| 2008/0092103 A1 * | 4/2008 | Aoyama ...................... 716/18 |

FOREIGN PATENT DOCUMENTS

| KR | 10-0270346 | 11/2000 |
| KR | 10-2007-0025715 A | 3/2007 |

\* cited by examiner

*Primary Examiner*—Cassandra Cox
(74) *Attorney, Agent, or Firm*—John P. White; Cooper & Dunham LLP

(57) ABSTRACT

A clock control circuit comprises a control signal generating unit configured to generate a control signal disabled in a predetermined state while in an active mode, and a clock transferring unit configured to transfer an external clock in response to the control signal.

19 Claims, 4 Drawing Sheets

CLOCK CONTROL CIRCUIT AND SEMICONDUCTOR MEMORY DEVICE USING THE SAME

TECHNICAL FIELD

This disclosure relates to a semiconductor memory device, and more particularly to a clock control circuit which can reduce unnecessary current consumption.

BACKGROUND

Generally, a semiconductor memory device receives an external signal and generates an internal clock which is used in operations of various buffers included within the semiconductor memory device.

A prior semiconductor memory device, as shown in FIG. 1, includes a first delay unit 100 which receives an external clock CLK and delays it by a prescribed delay interval to generate a first internal clock ICLK1, a second delay unit 101 which receives the external clock CLK and delays it by a prescribed delay interval to generate a second internal clock ICLK2, a third delay unit 102 which receives the external clock CLK and delays it by a prescribed delay interval to generate a third internal clock ICLK3, and a fourth delay unit 103 which receives the external clock CLK and delays it by a prescribed delay interval to generate a fourth internal clock ICLK4.

The first internal clock ICLK1 generated via the first delay unit 100 is used for controlling the operation of an address buffer 104, the second internal clock ICLK2 generated via the second delay unit 101 is used for controlling the operation of a command buffer 105, the third internal clock ICLK3 generated via the third delay unit 102 is used for controlling the operation of a data input buffer 106, and the fourth internal clock ICLK4 generated via the fourth delay unit 103 is used for controlling the operation of a data output buffer 107.

If such semiconductor memory device enters into a power-down mode or a refresh mode, it disables the first to fourth internal clocks ICLK1-ICLK4 generated by the first to fourth delay units 100-103, in order to interrupt the operations of the address buffer 104, the command buffer 105, the data input buffer 106 and the buffer output buffer 107 and thus reduce current consumption.

On the other hand, the semiconductor memory device may be in a Non-Operation state while in an active mode, in which the Non-operation state means an internal circuit of the semiconductor memory device does not perform any operation. Since the internal circuit of the semiconductor memory device does not operate in the Non-Operation state, the address buffer 104, the command buffer 105, the data input buffer 106 and the data output buffer 107 do not need to operate. However, if it enters into the active mode, the first to fourth internal clocks ICLK1-ICLK4 are synchronized to the external clock CLK and always toggled, which results in unnecessary current consumptions.

SUMMARY

In an aspect of this disclosure, a clock control circuit and a semiconductor memory device using the same are provided which are allowed to stop toggling an internal clock signal upon entering into an NOP (non-operation) state while in an active mode and thus reduce unnecessary current consumption.

In an embodiment, a clock control circuit is provided which comprises a control signal generating unit configured to generate a control signal disabled in a predetermined state while in an active mode, and a clock transferring unit configured to transfer an external clock in response to the control signal.

In another embodiment, preferably, the control signal generated by the control signal generating unit is disabled if the first to fourth command signals are disabled.

In another embodiment, the control signal generating unit comprises a logic element configured to perform a logic operation in response to the first to the third command signals, a buffer configured to buffer the fourth command signal, and a first logic unit configured to receive an output signal of the logic element and an output signal of the buffer and perform a logic operation to generate the control signal.

In another embodiment, preferably, the logic element performs a NAND operation.

In another embodiment, the buffer comprises a second logic unit which receives the fourth command signal and a power-up signal and performs a logic operation.

In another embodiment, preferably, the second logic unit performs an OR operation.

In another embodiment, preferably, the first logic unit performs an OR operation.

In another embodiment, preferably, the first command signal is a column address strobe signal, the second command signal is a row address strobe signal, the third command signal is a write enable signal, and the fourth command signal is a burst length signal.

In another embodiment of this disclosure, the clock transferring unit comprises a transfer element configured to transfer the external clock to an output node in response to the control signal, and a driving element configured to drive the output node in response to the control signal.

In another embodiment, preferably, the transfer element is an inverter driven when the control signal is enabled.

In another embodiment, the driving element is connected between the output node and a ground voltage to cause the output node to be pull-down driven in response to the control signal.

In another aspect of this disclosure, a semiconductor memory device comprises a clock control circuit configured to output an external clock in a predetermined state while in an active mode, a plurality of delay units configured to receive the external clock and generate a plurality of internal clocks, and a plurality of buffer units which are controlled in response to the internal clocks.

In another aspect of this disclosure, a semiconductor memory device comprises a control signal generating unit configured to generate a control signal disabled in a predetermined state while in an active mode and a internal clock generating unit configured to receive the control signal and an external clock, and generate an internal clock.

BRIEF DESCRIPTION OF THE DRAWINGS

The above and other aspects, features and other advantages of the subject matter of this disclosure will be more clearly understood from the following detailed description taken in conjunction with the accompanying drawings, in which.

DETAILED DESCRIPTION OF THE PREFERRED EMBODIMENTS

Hereinafter, the present invention will be described in detail through examples and embodiments. The examples and embodiments exemplify application of the present invention, and the scope of this disclosure and the appended claims is not limited by them.

Figure 1:
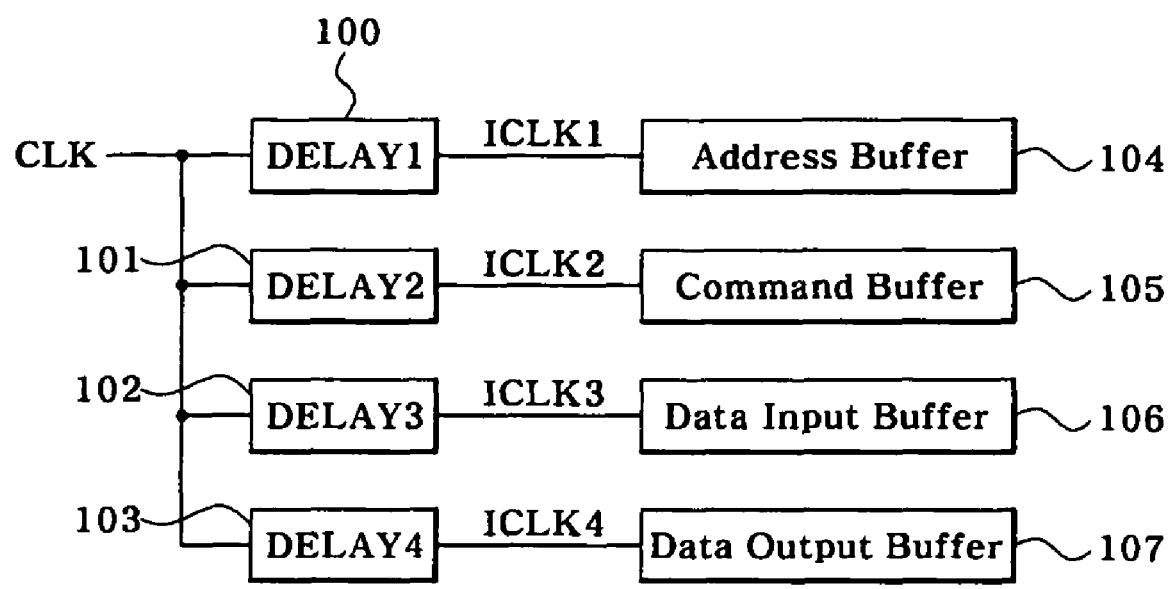
FIG. 1 is a block diagram illustrating a prior art structure for generating an internal clock and controlling buffers within a semiconductor memory device.
Figure 2:
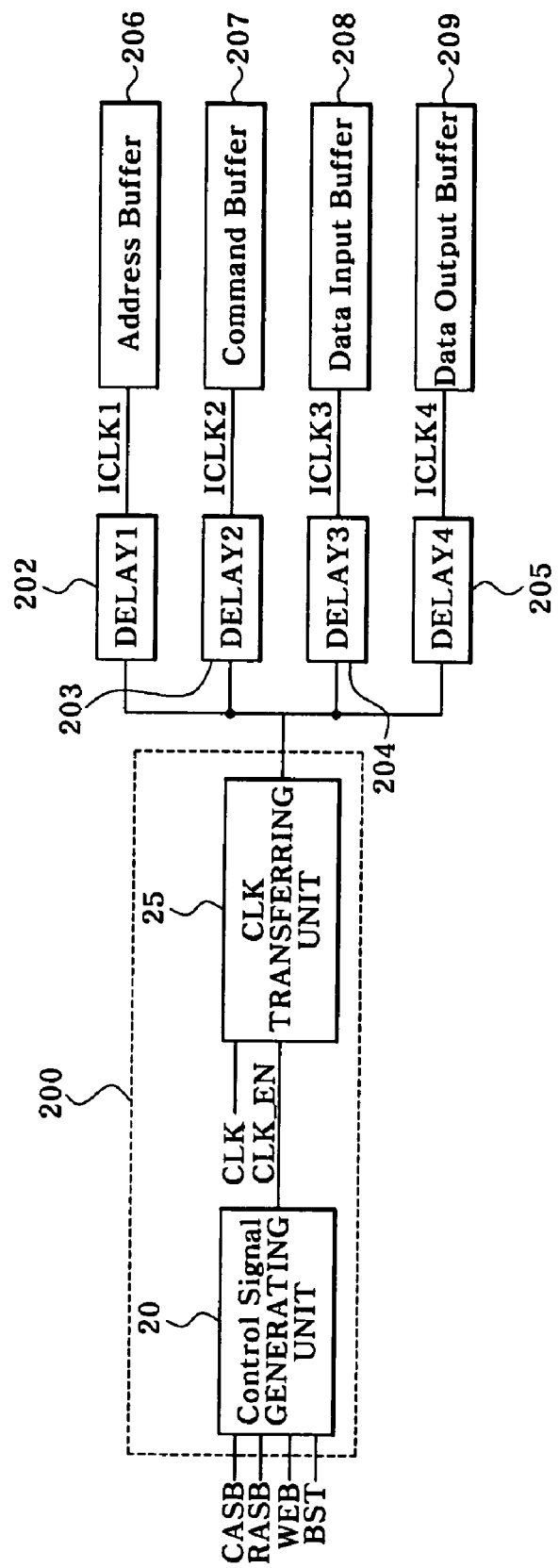
FIG. 2 is a block diagram showing a structure including a clock control circuit in a semiconductor memory device, according to an embodiment of this disclosure.

FIG. 2 is a block diagram showing the structure of a clock control circuit a semiconductor memory device, according to an embodiment of this disclosure.

The semiconductor memory device according to the present disclosure includes a clock control circuit 200 configured to output an external clock CLK which is disabled in an NOP state while in an active mode, first to fourth delay units 202-205 which receive the external clock CLK and generate first to fourth internal clocks ICLK1-ICLK4 respectively, an address buffer 206 controlled in response to the first internal clock ICLK1, a command buffer 207 controlled in response to the second internal clock ICLK2, a data input buffer 208 controlled in response to the third internal clock ICLK3, and a data output buffer 209 controlled in response to the fourth internal clock ICLK4.

The clock control circuit 200 is configured with a control signal generating unit 20 which generates a clock enable signal CLK_EN disabled in the NOP (non-operation) state while in the active mode, and a clock which transfers unit 25 transferring the external clock CLK in response to the clock enable signal CLK_EN.

The control signal generating unit 20 is configured with a NAND gate ND20 which receives a column address strobe signal CASB, a row address strobe signal RASB and a write enable signal WEB and performs a NAND operation, a first logic unit 21 which receives a burst length signal BST and a power-up signal PWRUP and performs a logic OR operation, and a second logic unit 22 which receives an output signal of the NAND gate ND20 and an output signal of the first logic unit 21 and performs a logic OR operation to generate the clock enable signal CLK_EN. Herein, the column address strobe signal CASB is a signal for strobing the column address, the row address strobe signal RASB is a signal for strobing the row address, and the write enable signal WEB is a signal enabled for the write operation. Further, the burst length signal BST is a signal enabled in order to input/output a plurality of data at the same time in response to one-time command in read or write operations. The power-up signal PWRUP is raised to a high level at an initial operation stage (power-up section) of the semiconductor memory device and transited into a low level after finishing the power-up section. Generally, since it enters into the active mode after finishing the power-up section, the power-up signal PWRUP is at a low level in the active mode.

The clock transferring unit 25 is configured with an inverter IV24 which receives the clock enable signal CLK_EN and inverts it, an inverter IV25 which inverts an output signal of the inverter IV24, an inverter IV22 which inverts the external clock CLK, an inverter IV23 which inverts the output signal of the inverter IV22 in response to the output signals of the inverter I24 and the inverter IV25 and transfers it to an output terminal OUT, and an NMOS transistor N20 which pull-down drives the output terminal OUT in response to an output signal of the inverter IV24.

The operation of such a semiconductor memory device will be hereinafter explained referring to FIG. 2 to FIG. 5.

If the column address strobe signal CASB, the row address strobe signal RASB and the write enable signal WEB are disabled at a high level after entering into the active mode, the semiconductor memory device enters an NOP state, in which the internal circuit of the semiconductor memory device does not operate. Nevertheless, even though the column address strobe signal CASB, the row address strobe signal RASB and the write enable signal WEB are at a high level, the data input/output operations are performed according to the burst length for the read or write operations if the burst length signal BST is at a high level, whereby it is not held in the NOP state.

Therefore, the column address strobe signal CASB, the row address strobe signal RASB and the write enable signal WEB must be disabled at a high level and the burst length signal BST must be disabled at a low level, in order for the semiconductor memory device to enter from the active mode into the NOP state.

Figure 3:
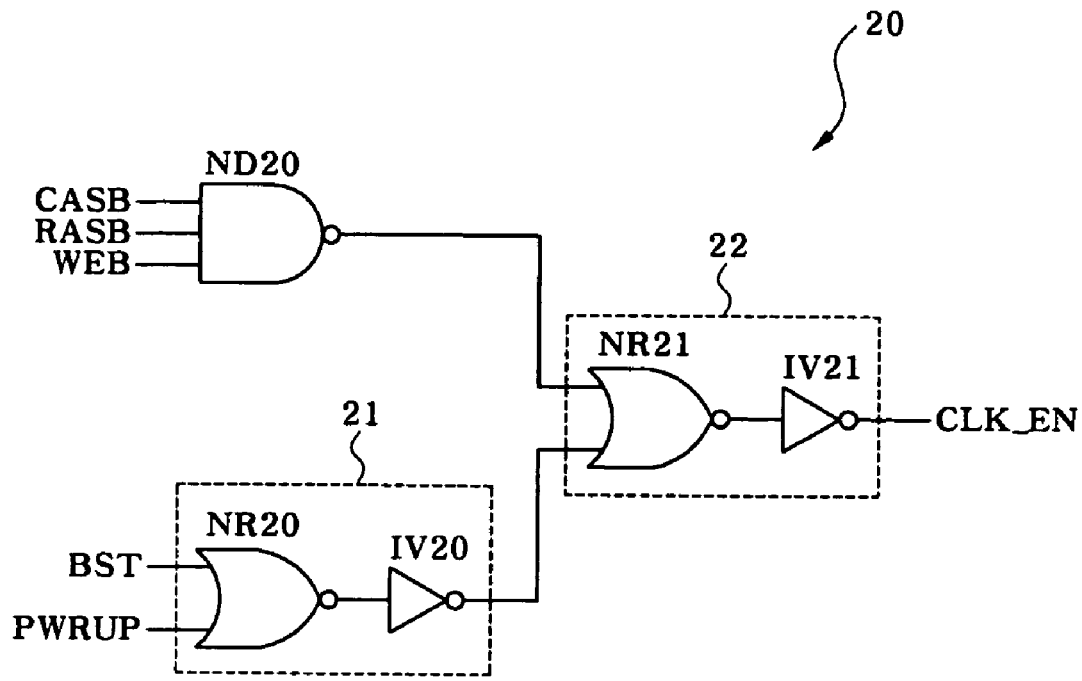
FIG. 3 is a circuit diagram showing a control signal generating unit included in the clock control circuit shown in FIG. 2.

In the NOP state, the control signal generating unit 20 shown in FIG. 3 generates the clock enable signal CLK_EN disabled at a low level. More specifically, the NAND gate ND20 inputs the column address strobe signal CASB, the row address strobe signal RASB and the write enable signal WEB of high level and outputs the signal of low level, and the first logic unit 21 inputs the burst length signal BST and the power-up signal of low level and outputs the signal of low level. Therefore, the clock enable signal CLK_EN outputted from the second logic unit 22 is disabled at a low level.

Figure 4:
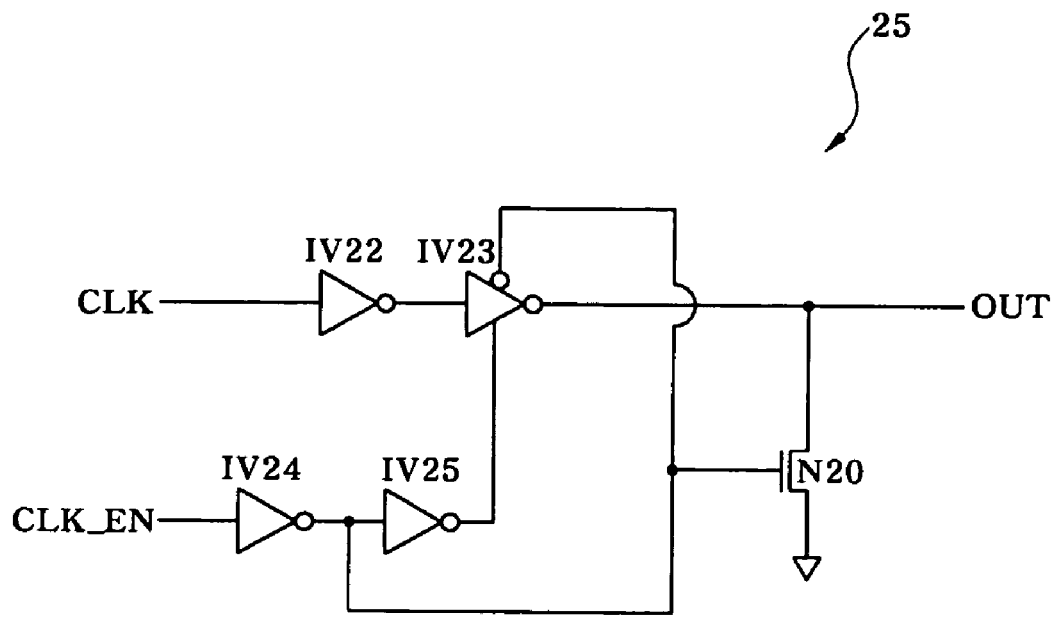
FIG. 4 is a circuit diagram showing a clock transferring unit included in the clock control circuit shown in FIG. 2.

Further, the clock transferring unit 25 shown in FIG. 4 stops the external clock CLK from being transferred in the NOP state. More specifically, if the clock enable signal CLK_EN of low level is inputted, the output signal of the inverter IV24 becomes a high level and the output signal of the inverter IV25 becomes a low level, which results in the inverter IV23 being prevented from being operated and the NMOS transistor N20 being turned on to cause the output terminal OUT to be pull-down driven to a ground voltage level VSS.

As such, since the external clock CLK is not outputted via the output terminal OUT in the NOP state, the first to fourth internal clocks ICLK1-ICLK4 generated by the first to fourth delay units 202-205 are not toggled and the address buffer 206, the command buffer 207, the data input buffer 208 and the data output buffer 209 are prevented from being operated, whereby current consumption can be reduced in the NOP state.

As mentioned above, if the semiconductor memory device according to this embodiment is held in the NOP state after entering into the active mode, it prohibits the external clock CLK from being inputted to the first to fourth delay units 202-205 and thereby causes the first to fourth internal clocks ICLK1-ICLK4 not to be toggled, which results in reducing current consumption.

Figure 5:
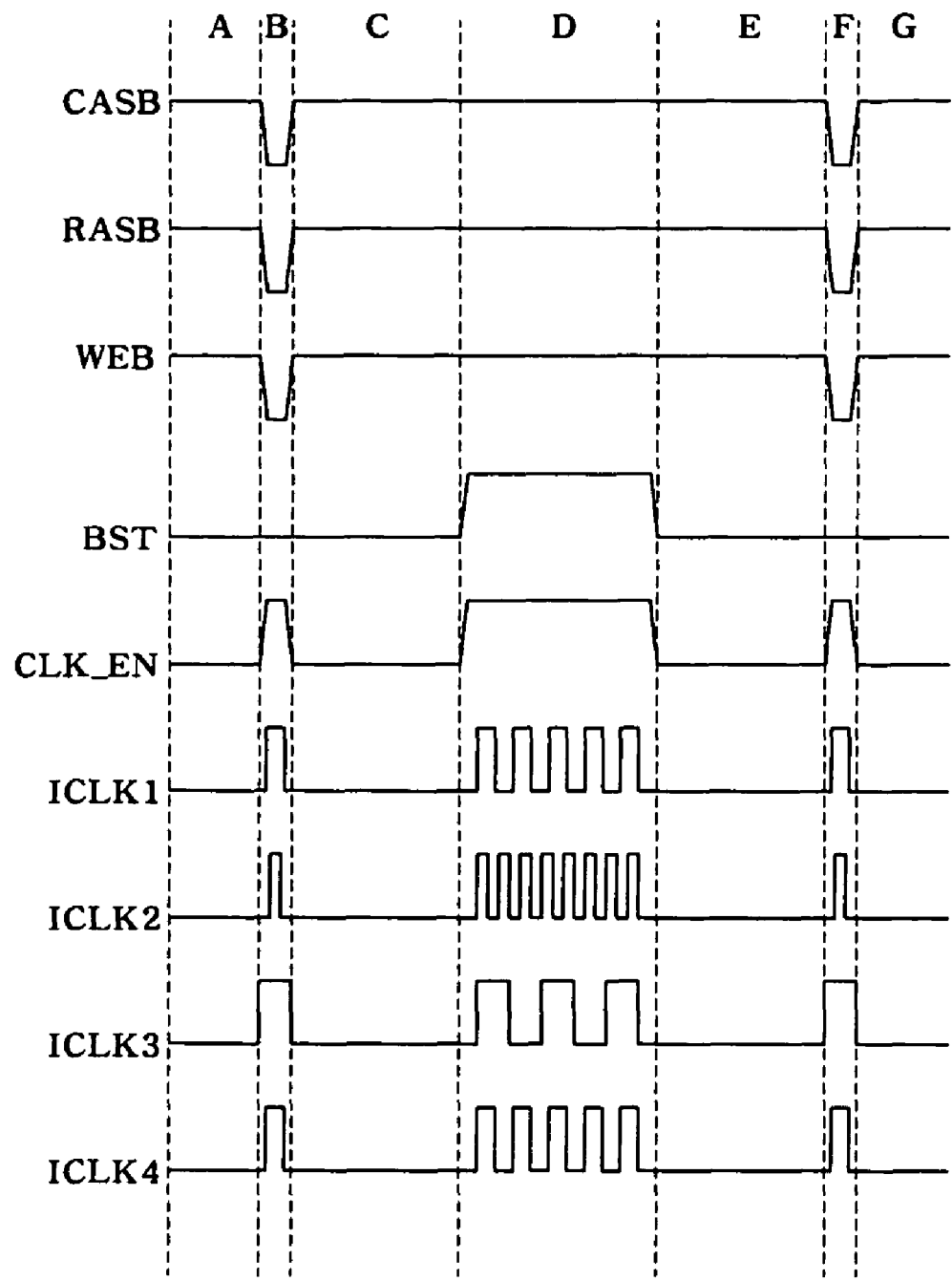
FIG. 5 is a timing diagram illustrating an operation of the semiconductor memory device shown in FIG. 2.

It will be appreciated that the current consumption reduction effect of the semiconductor memory device according to this embodiment is evident from referring to FIG. 5.

As shown in FIG. 5, the column address strobe signal CASB, the row address strobe signal RASB and the write enable signal WEB are disabled at a high level after entering into the active mode and the internal circuit of the semiconductor memory device enters the NOP state in sections A, C, E, G where the burst length signal BST is at a low level. In the NOP state, the clock enable signal CLK_EN goes to a low level and the first to fourth internal clocks ICLK1-ICLK4 are not toggled, whereby unnecessary current is not consumed.

Meanwhile, the clock enable signal CLK_EN goes to a high level in sections B, F where the column address strobe signal CASB, the row address strobe signal RASB and the write enable signal WEB are enabled at a low level for the purpose of the read or write operation in the active mode or in a section D where the burst length signal BST is enabled at a high level to perform the data input/output for the read or write operation, thereby causing the first to fourth internal clocks ICLK1-ICLK4 to be toggled. Subsequently, the address buffer 206, the command buffer 207, the data input buffer 208 and the data output buffer 209 are allowed to be operated by receiving the first to fourth internal clocks ICLK1-ICLK4 toggled.

This disclosure claims priority to Korean application number 10-2008-0039587 filed on Apr. 28, 2008, the entire contents of which are incorporated herein by reference.

What is claimed is:

1. A clock control circuit, comprising:
   a control signal generating unit configured to generate a control signal disabled in a predetermined state while in an active mode;
   a transfer element configured to transfer an external clock to an output node in response to the control signal; and
   a driving element configured to drive the output node in response to the control signal.

2. The clock control circuit of claim 1, wherein the control signal generating unit configured to receive first, second, third and fourth command signal, and generate the control signal.

3. The clock control circuit of claim 2, wherein the control signal generated by the control signal generating unit is disabled if the first, second, third and fourth command signals are disabled.

4. The clock control circuit of claim 3, wherein the first command signal is a column address strobe signal, the second command signal is a row address strobe signal, the third command signal is a write enable signal, and the fourth command signal is a burst length signal.

5. The clock control circuit of claim 2, wherein the control signal generating unit comprises:
   a logic element configured to perform a logic operation in response to the first to third command signals;
   a buffer configured to buffer the fourth command signal; and
   a first logic unit configured to receive an output signal of the logic element and an output signal of the buffer and perform a logic operation to generate the control signal.

6. The clock control circuit of claim 5, wherein the buffer comprises a second logic unit which receives the fourth command signal and a power-up signal and performs a logic operation.

7. The clock control circuit of claim 1, wherein the transfer element is an inverter driven when the control signal is enabled.

8. The clock control circuit of claim 1, wherein the driving element is connected between the output node and a ground voltage to cause the output node to be pull-down driven in response to the control signal.

9. A semiconductor memory device, comprising:
   a control signal generating unit configured to generate a control signal disabled in a predetermined state while in an active mode;
   a transfer element configured to transfer an external clock to an output node in response to the control signal;
   a driving element configured to drive the output node in response to the control signal;
   a plurality of delay units configured to receive the external clock and generate a plurality of internal clocks; and
   a plurality of buffer units controlled in response to the internal clocks.

10. The semiconductor memory device of claim 9, wherein the control signal generating unit configured to receive first, second, third and fourth command signals, and generate the control signal.

11. The semiconductor memory device of claim 10, wherein the control signal generating unit generates the control signal disabled if the first, second, third and fourth command signals are disabled.

12. The semiconductor memory device of claim 11, wherein the first command signal is a column address strobe signal, the second command signal is a row address strobe signal, the third command signal is a write enable signal, and the fourth command signal is a burst length signal.

13. The semiconductor memory device of claim 10, wherein the control signal generating unit comprises:
   a logic element configured to perform logic operation in response to the first to third command signals;
   a buffer configured to buffer the fourth command signal; and
   a first logic unit configured to receive an output signal of the logic element and an output signal of the buffer and perform a logic operation to generate the control signal.

14. The semiconductor memory device of claim 13, wherein the buffer comprises a second logic unit which receives the fourth command signal and a power-up signal and performs a logic operation.

15. The semiconductor memory device of claim 9, wherein the buffer units comprise an address buffer, a command buffer, a data input buffer and a data output buffer.

16. A semiconductor memory device, comprising:
   a control signal generating unit configured to generate a control signal disabled in a predetermined state while in an active mode;
   a transfer element configured to transfer an external clock to an output node in response to the control signal;
   a driving element configured to drive the output node in response to the control signal; and
   a plurality of delay units configured to receive the external clock and generate a plurality of internal clocks.

17. The semiconductor memory device of claim 16, wherein the control signal generating unit configured to receive first, second, third and fourth command signals, and generate the control signal.

18. The semiconductor memory device of claim 16, wherein the transfer element is an inverter driven when the control signal is enabled.

19. The semiconductor memory device of claim 16, wherein the driving element is connected between the output node and a ground voltage to cause the output node to be pull-down driven in response to the control signal.

* * * * *